United States Patent [19]
Suzuki et al.

[11] Patent Number: 5,124,888
[45] Date of Patent: Jun. 23, 1992

[54] ELECTRIC CIRCUIT APPARATUS

[75] Inventors: Satoshi Suzuki; Yoshihiro Kakisima, both of Shizuoka, Japan

[73] Assignee: Tokyo Electric Co., Ltd., Tokyo, Japan

[21] Appl. No.: 644,432

[22] Filed: Jan. 22, 1991

[30] Foreign Application Priority Data

Jan. 25, 1990 [JP] Japan .................................. 2-15232
Jan. 25, 1990 [JP] Japan .................................. 2-15233
Jun. 30, 1990 [JP] Japan .................................. 2-173884

[51] Int. Cl.[5] ............................................ H05K 1/14
[52] U.S. Cl. .................... 361/395; 361/393; 361/399; 361/413; 361/426; 439/76; 439/78
[58] Field of Search ............. 361/392, 394, 395, 398, 361/399, 413, 426; 439/74, 76, 75, 77, 78; 363/141

[56] References Cited

U.S. PATENT DOCUMENTS

| | | | |
|---|---|---|---|
| 3,668,476 | 6/1972 | Wrabel et al. | 317/101 |
| 4,850,884 | 7/1989 | Sawai et al. | 439/76 |
| 4,858,071 | 8/1989 | Manabe et al. | 361/386 |

FOREIGN PATENT DOCUMENTS

61-171199 10/1986 Japan .

*Primary Examiner*—Leo P. Picard
*Assistant Examiner*—Young S. Whang
*Attorney, Agent, or Firm*—Frishauf, Holtz, Goodman & Woodward

[57] ABSTRACT

An electric circuit apparatus comprises a long and narrow case having two openings at both longitudinal ends thereof, a long and narrow circuit board contained in the case, on which electrical parts are attached and in which an electric circuit connected to the parts is mounted, and a pair of terminal bases mounted at the two openings within the case and each including at least one external connecting terminal externally opened in the longitudinal direction of the case. The terminal bases support both longitudinal ends of the circuit board and have the external connecting terminal connected to the electric circuit of the circuit board. The electrical parts are positioned within the respective height ranges of the terminal bases.

15 Claims, 9 Drawing Sheets

ELECTRIC CIRCUIT APPARATUS

BACKGROUND OF THE INVENTION

1. Field of the Invention

This invention relates to an electric circuit apparatus, and more specifically to an electric circuit apparatus wherein a circuit board, on which electronic and/or electric parts are attached and in which an electric circuit connected to the parts is mounted, is contained in a long and narrow case having two openings at both ends thereof, and a pair of terminal bases including at least one external terminal is provided at the two openings within the case.

2. Description of the Related Art

As such electric circuit apparatus, for instance, an electric discharge lamp stabilizer used for lighting and operating a discharge lamp such as a fluorescent lamp is well known.

Figure 1:
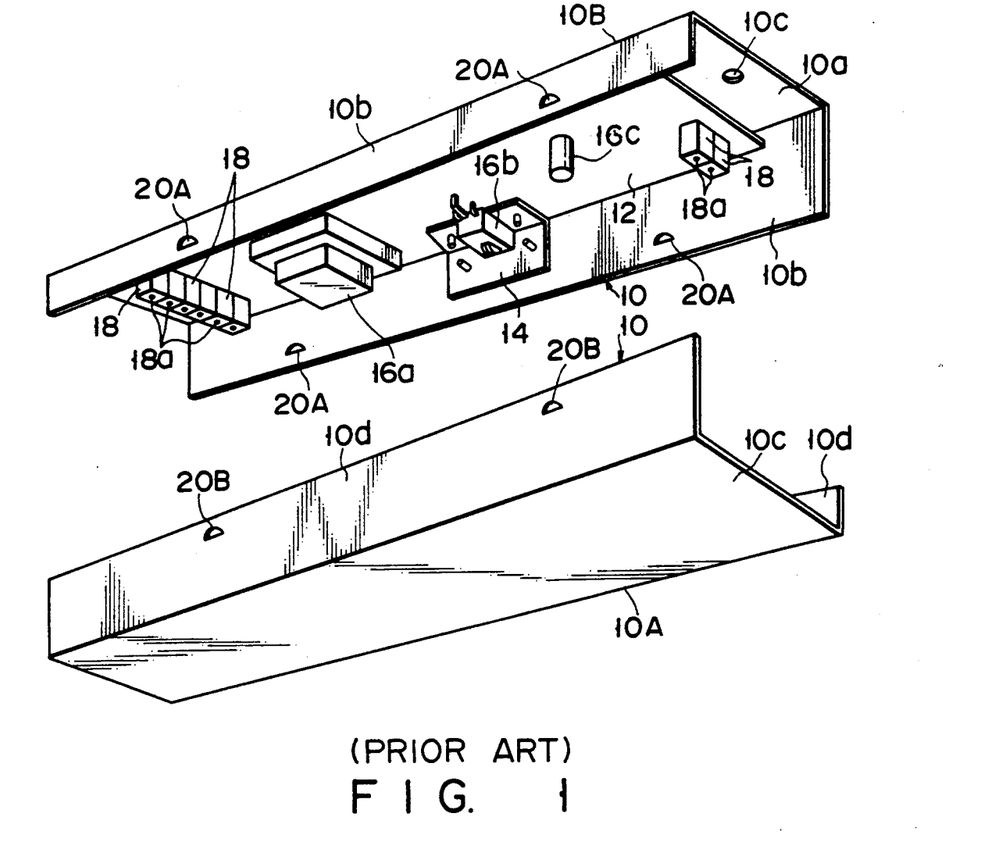
FIG. 1 is a schematic perspective view showing an electronic discharge lamp stabilizer which is one type of a conventional electric circuit apparatus used for lighting and operating a discharge lamp such as a fluorescent bulb, in which a cover of a case of the stabilizer is removed from a main body.

As shown in FIG. 1, the conventional electronic discharge lamp stabilizer comprises case 10 shaped in a rectangular pipe and constructed by cover 10A and main body 10B which are removable upwardly and downwardly. Main body 10B has a pair of side board portions 10b which are downwardly extending substantially parallel with each other from both longitudinally extending side edges of main board portion 10a shaped in an rectangle. In both longitudinal ends of main board portion 10a, through holes 10c are formed for fixing main body 10B by means of a publicly known fixing means such as screws for instance to a chassis of lighting equipment such as a fluorscent lamp (not shown).

Between the pair of side board portions 10b, a long and narrow electric circuit board 12 extending along main board portion 10a is disposed. Electric circuit board 12 is screwed to radiating board 14 which is screwed to one side board portion 10b of main body 10B. A predetermined wiring is printed on a surface of electric circuit board 12 facing the lower opening of main body 10B, and connecting terminals 17 of, for instance, transforms 16a as an inverter element having a core, switching transistor 16b used as a switching element and closely contacted onto radiating board 14, and other various electronic and/or electric parts 16c, are passing through and soldered to predetermined positions of the wiring, whereby they are electrically connected to the wiring to construct a discharge lamp operating circuit. A plurality of terminal bases 18 having external connecting terminals are attached at both longitudinal ends on a lower surface of electric circuit board 12, and the external connecting terminals of the individual terminal bases 18 are also electrically connected to the predetermined positions of the predetermined wiring on the lower surface of electric circuit board 12. Openings 18a of the external connecting terminals of the individual terminal bases 18 are downwardly facing, the external connecting terminals of one group of terminal bases 18 disposed at one longitudinal end of electric circuit board 12 are used to be connected to a general commercial power supply, and the external connecting terminals of the remaing group of terminal bases 18 disposed at the other longitudinal end of electric circuit board 12 are used to be connected to a fluorescent bulb socket.

Cover 10A also has a pair of side board portions 10d downwardly extending out substantially in parallel with each other from both longitudinally extending side edges of rectangular main board portions 10c.

Engaging holes 20A are formed in a plurality of positions of each of the pair of side board portions 10b of main body 10B so as to be arranged along the longitudinal direction thereof, and engaging protrusions 20B are formed in a plurality of positions of each of the pair of side board portions 10d of cover 10A so as to be arranged along the longitudinal direction thereof.

Figure 2:
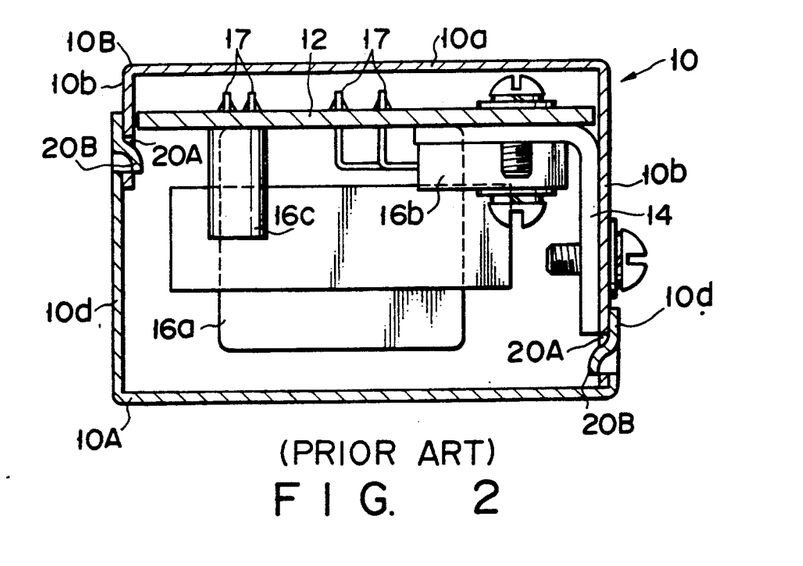
FIG. 2 is a schematic cross-sectional view of the electronic discharge lamp stabilizer in FIG. 1, in which the cover of the case is attached to the main body.

In order to connect cover 10A to main body 10B, the pair of side board portions 10d of cover 10A are firstly outwardly expanded so as to move them away from each other, and then the pair of side board portions 10d of cover 10A are slipped onto outer surfaces of the pair of side board portions 10b of main body 10B from the lower side thereof. At this time, the expanding force applied on the pair of side board portions 10d is removed, the plurality of engaging protrusions 20B of the pair of side board portions 10d of cover 10A can be made to engage with the plurality of engaging holes 20A of the pair of side board portions 10b of main body 10B, as shown in FIG. 2. This allows cover 10A to be removably coupled with main body 10B and constitute case 10 of a rectangular pipe in conjunction with main body 10B.

The wiring work for the conventional electronic discharge lamp stabilizer constructed as described above is performed after the electronic discharge lamp stabilizer is fixed to the chassis of the fluorescent lamp lighting equipment, not shown. In the wiring work, cover 10A is firstly removed from main body 10B, then one ends of the general commercial power supply leads are inserted into openings 18a of the external connecting terminals of terminal bases 18 for power supply connection to be connected to the corresponding external terminals, and one ends of the leads from the fluorescent bulb socket of the fluorescent lamp lighting equipment are inserted into openings 18a of the external connecting terminals of terminal bases 18 for fluorescent lamp connection to be connected to the corresponding external connecting terminals.

Since openings 18a of the external connecting terminals of terminal bases 18 are downwardly facing in the conventional electronic discharge stabilizer constructed as stated above, cover 10A must be removed from main body 10B in the above-mentioned wiring work. In addition, by the same reason, the leads connected to the external connecting terminals of terminal bases 18 must change an extending direction thereof from a downward direction to a horizontal direction as they go away from the external connecting terminals, so that they do not prevent the work of attaching cover 10A to main body 10B after the wiring work is completed.

Accordingly, in order to allow the downward extension of the leads from terminal bases 18 and the subsequent change in the extending direction of the leads, the height of cover 10A must be set so that a sufficient distance can be maintained between circuit board 12 supported by main body 10B and main board portion 10c of cover 10A when cover 10A is attached to main body 10B. This hinders the attempt of reducing the height of the conventional electronic discharge stabilizer, and hence hinders the attempt of reducing the height of the traditional fluorescent lamp lighting equipment.

Moreover, the engaging and disengaging works of cover 10A in regard of main body 10B are combersome in the wiring work

SUMMARY OF THE INVENTION

This invention was made under the above circumstances, and it is an object of this invention to provide an electric circuit apparatus including an electronic discharge lamp stabilizer, which can not only eliminate the cumbersome engaging and disengaging works of the cover with respect to the main body of the case but also reduce the height as compared with the conventional one, and hence which can reduce the height of electric equipment such as fluorescent lamp lighting equipment as compared with the conventional one.

In order to achieve the object, an electric circuit apparatus according to this invention comprises: a long and narrow case having two openings at both longitudinal ends thereof; a long and narrow circuit board contained in the case, on which electronic and/or electric parts are attached and in which an electric circuit connected to the parts is mounted; and a pair of terminal bases mounted at the two openings, within the case and each including at least one external connecting terminal outwardly opened in the longitudinal direction of the case, and supporting both longitudinal ends of the circuit board and having the aforesaid external connecting terminal connected to the electric circuit of the circuit board, wherein the electronic and/or electric parts on the circuit board are positioned within the ranges of the individual heights of the pair of terminal bases.

In the electric circuit apparatus constructed as described above, since each of the external connecting terminals of the pair of terminal bases is outwardly opened in the longitudinal direction of the case, the cumbersome engaging and disengaging works of the cover with respect to the main body of the case can be obviated in the wiring work for the electric circuit apparatus. In addition to this, the height of the case is enabled to be reduced to the heights of the pair of terminal bases because the electronic and/or electric parts on the circuit board are positioned in the ranges of the respective heights of the pair of terminal bases. This allows the height of the electric circuit device to be reduced as compared with the conventional one, and consequently allows the height of electric equipment using the electric circuit apparatus such, for instance, fluorescent lamp lighting equipment to be reduced as compared with the conventional one.

In the electric circuit apparatus of the invention of this application characterized by the aforementioned construction, it is preferable that the pair of terminal bases block the two openings of the case.

With such preferred construction, it is prevented dust from entering into an inner space of the case through the two openings.

In the electric circuit apparatus of the invention of this application characterized by the construction as described above, it is also preferable that a positioning projection is mounted on each of the pair of terminal bases, and positioning holes are formed in the longitudinal ends of the case, into which the positional projections of the terminal bases are inserted.

With such preferred construction, it is easy to mount the pair of terminal bases at predetermined positions in the two openings of the case.

In the electric circuit apparatus of the invention of this application characterized by the aforementioned construction, it is preferable that the above described case has a main body and a cover which can be separated from each other in the height direction, and that the aforesaid external connecting terminal has a self locking type terminal fitting.

The case of such construction facilitates not only the assembly of the electric circuit apparatus but also an access into the case, which is needed for a quality suspection of the apparatus and an adjustment of electric current value in each block of an electric circuit of the apparatus. The self locking type terminal fittings of the external connecting terminals facilitates the wiring work of the power supply leads and the load side leads in regard of the external connecting terminals of the terminal bases of the electric circuit apparatus.

In the electric circuit apparatus of the invention of this application characterized by the construction as described above, it is also preferable that an electrical insulator is mounted on an inner surface of the case facing the above-mentioned circuit board.

Such arrangement of the electrical insulator enables reduction of the electrical insulating space required between the electronic and/or electric parts on the circuit board and the inner surface of the case, and hence further facilitates reduction in the height of the electric circuit apparatus, and more facilitates reduction in the height of electric equipment using the electric circuit apparatus, for instance, fluorescent lamp lighting equipment.

Even in the event that the electrical insulator is placed as described above, it is important for facilitating the assembly of the electric circuit apparatus that the aforesaid case includes a main body and a cover which can be separated from each other in the height direction. In this case, the above-mentioned electrical insulator is mounted on inner surfaces of the main body and cover, which are opoposed to the circuit board.

If the electrical insulator is mounted as stated above in regard of the case having the main body and case which can be separated from each other in the height direction, it is more preferable that relatively large-sized oblong parts among the electronic and/or electric parts on the circuit board are placed on one side surface of the circuit board so that the longitudinal directions of themselves lie along the one side surface, and that relatively small-sized parts among the electronic and/or electric parts are placed on the other side surface of the circuit board.

Such arrangement of the electronic and/or electric parts with respect to both side surfaces of the circuit board miniaturizes the size of the circuit board required for the arrangement of the electronic and/or electric parts on the circuit board. Consequently, the miniaturization of the electric circuit apparatus is further facilitated.

In the case provided with the main body and the cover which can be separated from each other in the height direction, it is preferable that the main body of the case includes a rectangular main board portion and a pair of side board portions which are projecting substantially in parallel with each other in one side surface side of the main board from both longitudinally extending side edges of the main board portion, the cover of the case includes a rectangular main board portion and a pair of side board portions which are projecting substantially in parallel with each other in one side surface side of the main board portion from both longitudinally extending side edges of the main board portion, and the cover is detachably connected to the main body with its main board portion opposing to the main board portion of the main body and the pair of side board portions of itself overlapping the pair of side board portions of the main body, thereby constituting a case in a rectangular pipe.

The main body and cover of such construction are easy to form, and the work of combining the main body and case of such construction with each other is also easy because the respective pairs of side board portions can be utilized as guides. The case constructed by combining the main body and cover of such construction with each other to form a rectangular pipe exhibits a high resisting force against an external force applied thereto.

The size of the circuit board required for arranging the electronic and/or electric parts on the circuit board is made small, and accordingly the miniaturization of the electric circuit apparatus is accelerated by placing large-sized oblong parts having relatively large voltage and current values among the electronic and/or electric parts on one side surface of the circuit board so that the longitudinal directions of themselves lie along the one side surface, and by placing relatively small-sized parts having relatively small voltage and current values among the electronic and/or electric parts on the other side surface of the circuit board.

If the electronic and/or electric parts on the circuit board include a switching element having a radiating board, and if an electrical insulator is mounted on the inner surface of the case which is opposed to the circuit board, it is preferable that the electrical insulator has an opening at a position corresponding to the radiating board of the switching element on the circuit board, and that the radiating board of the switching element is inserted into the opening of the electrical insulator to abut on the inner surface of the case.

Since such construction enhances the heat radiating efficiency of the radiating board, it enables an electrical insulating space required between the electronic and/or electric parts on the circuit board and the case to be made smaller, and hence further reduces the height of the electric circuit apparatus or of electric equipment using the electric circuit apparatus, for instance, fluorescent lamp lighting equipment.

If, in the electric circuit apparatus according to this invention characterized by the above-mentioned arrangement, the electric circuit of the circuit board includes inductance and switching elements and constitutes an inverter lighting circuit for lighting and operating a discharge bulb, and further includes a noise filter, the external connecting terminal in one of the pair of terminal bases is used for connection with a power supply, and the external connecting terminal in the other of the pair of terminal bases is used for connection with the discharge bulb. And, it is preferable that the switching element in the electric circuit is placed between the pair of terminal bases, the noise filter in the electric circuit is disposed between one longitudinal end of the circuit board and the switching element to cut the noise in the current which is inputted from the external connecting terminal of one terminal base for connecting with the power supply and which is supplied to the inverter lighting circuit, and the inductance element in the electric circuit is placed between the other longitudinal end of the circuit board and the switching element to feed out the current supplied to the inverter lighting circuit through the noise filter from the external connecting terminal of one terminal base for connecting with the power supply to the external connecting terminal of the other terminal base for connecting with the discharge bulb. The noise filter also prevent a high frequency generated in the inductance element from leaking out to the general commercial electric power source.

Such arrangement of the switching element, noise filter and inductance element on the circuit board optimizes the arrangement of the switching element which is easily affected by heat with respect to the inductance element which has a large heat radiating amount, in consideration of the miniaturization of the circuit board and the heat effect of the switching element.

Since the inductance element in the electric circuit on the circuit board includes a core, it is preferable that an opening into which the core of the inductance is inserted is formed on the circuit board.

By placing the inductance element on one side surface of the circuit board with the core being inserted into the opening of the circuit board, the height by which the inductance element projects out from one side surface of the circuit board can be decreased. By decreasing the height by which the largest inductance element in the circuit projects out in the inverter lighting circuit as described above, decrease in the height of the electric circuit apparatus and hence decrease in the height of electric equipment using the electric circuit apparatus, for instance, fluorescent lamp lighting equipment, are promoted.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

The various embodiments of this invention are now described in detail with reference to the attached FIGS. 3 to 14.

DETAILED DESCRIPTION OF THE PREFERRED EMBODIMENTS

Figure 3:
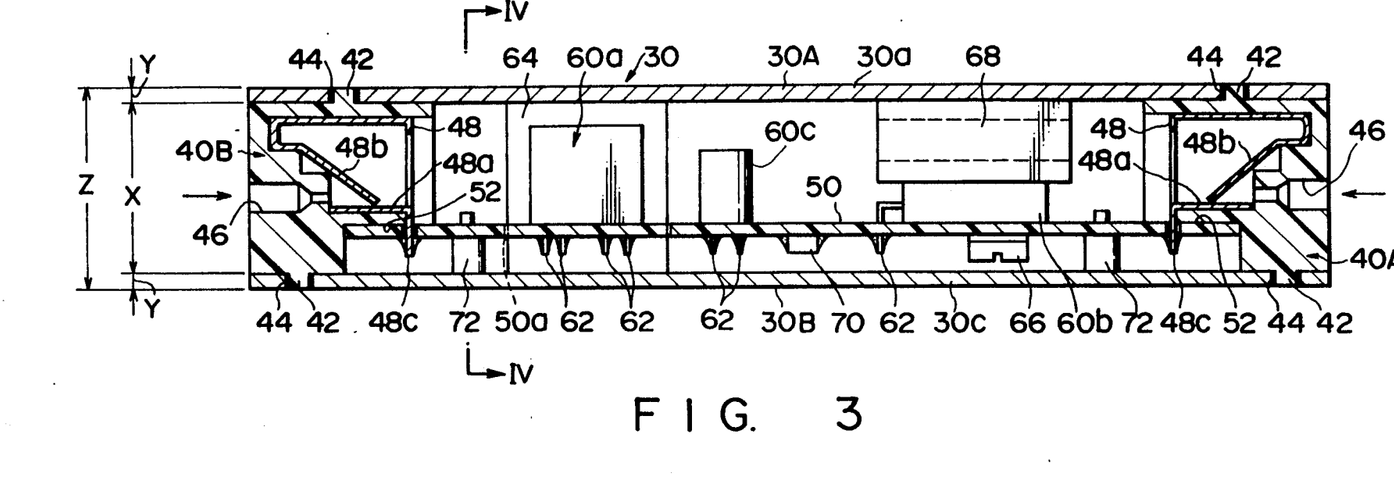
FIG. 3 is a schematic longitudinal sectional view of an electronic discharge lamp stabilizer according to a first embodiment of this invention, which is one type of the electric circuit apparatus used for lighting and operating a discharge lamp such as a fluorescent lamp.
Figure 4:
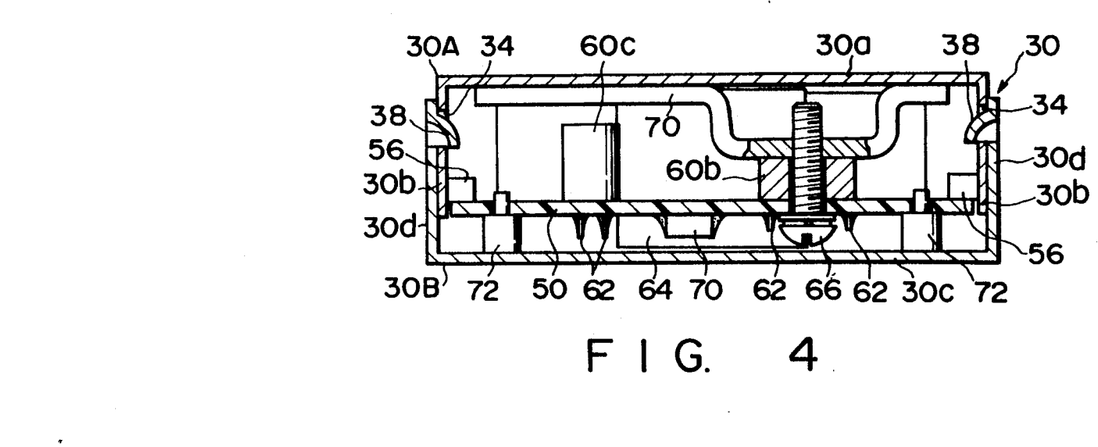
FIG. 4 is a schematic cross-sectional view taken along the line IV—IV in FIG. 3.
Figure 5:
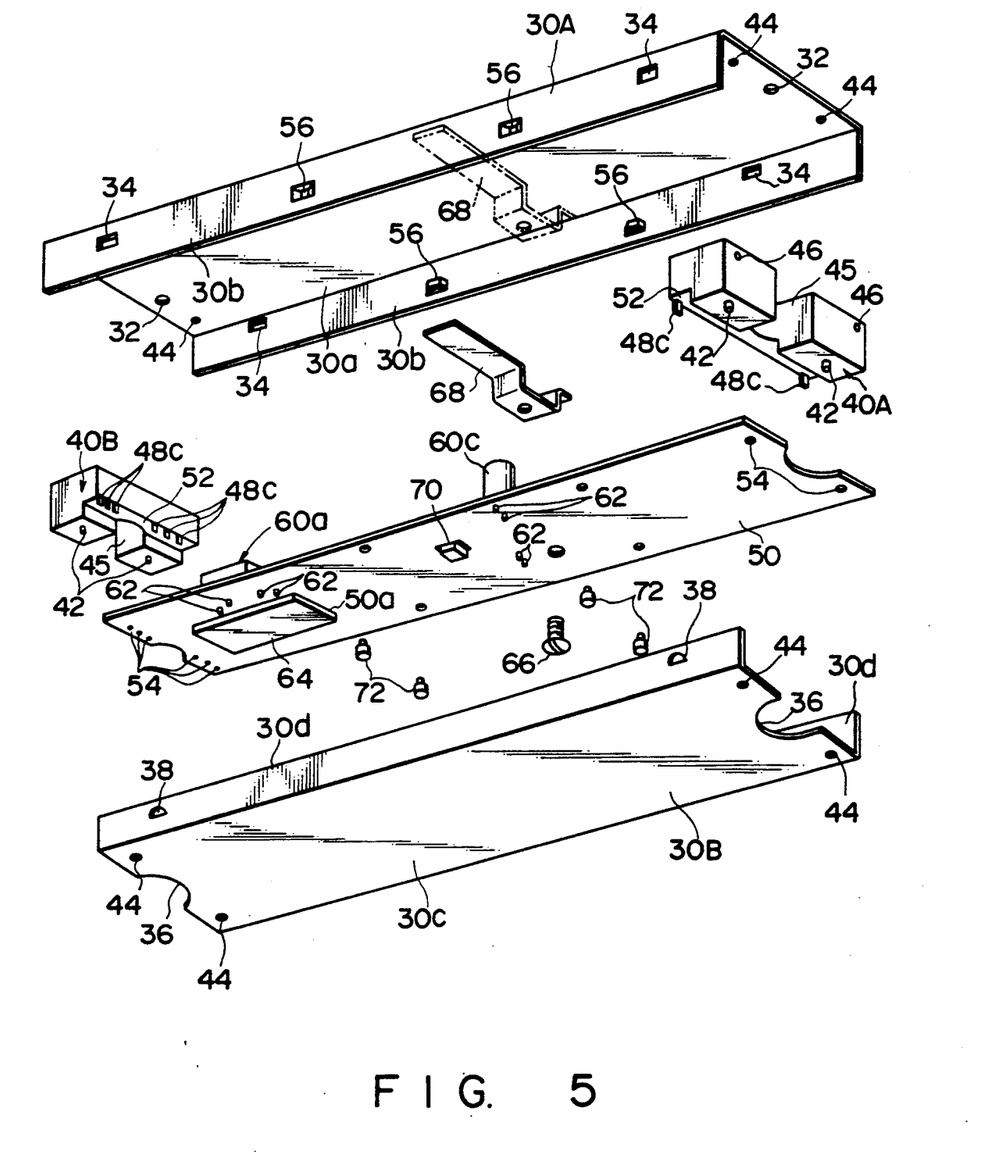
FIG. 5 is a schematic exploded perspective view of the electronic discharge lamp stabilizer in FIG. 3.

In FIGS. 3 to 5 show an electronic discharge lamp stabilizer according to a first embodiment of this invention, which is one type of electric circuit apparatuses used for lighting and operating a discharge lamp such as a fluorescent lamp.

In FIGS. 3 and 4, reference numeral 30 denotes an external case shaped in a rectangular pipe, which is made of a non-magnetic sheet metal such as aluminum or an alloy thereof. External case 30 includes main body 30A and cover 30B, as particularly well shown in FIG. 5, which can be divided into two parts in the upward and downward directions and have substantially the same size and shape as each other.

Main body 30A includes rectangular main body (or main board) portion 30a and a pair of side body (or side board) portions 30b which are extending in one direction substantially in parallel with each other from the pair of longitudinally extending long edges of main board portion 30a.

Fixing means through holes 32 are formed in both longitudinal ends of main board portion 30a substantially at the center in the width direction thereof, and into fixing means through holes 32, well known fixing means (not shown), for instance, fixing screws are inserted to fix main board portion 30a to a chassis (not shown) of a fluorescent lamp lighting equipment which uses the electronic discharge lamp stabilizer according to the first embodiment. In both longitudinal ends of each of the pair of side board portions 30b at positions close to main board portion 30a, engaging holes 34 are formed.

Cover 30B also includes rectangular main cover (or main board) portion 30c and a pair of side cover (or side board) portions 30d which are extending in one direction substantially parallel with each other from the pair of longitudinally extending long edges of main board portion 30c.

In both longitudinal ends of main board portion 30c at substantially the center in the width direction thereof, cutouts 36 are formed for facilitating the insertion and removal of the fixing means with respect to fixing means through holes 32 in both longitudinal ends of main board portion 30a. In both longitudinal ends of each of the pair of side board portions 30d at positions remote from main board portion 30c, engaging claws 38 are formed.

The work of removably coupling together main body 30A and cover 30B formed as described above is performed as follows. After expanding the pair of side board portions 30d of cover 30B so as to move them away from each other, oppose them to outer surfaces of the pair of side board portions 30b of main body 30A, and thereafter remove the expanding force loaded on the pair of side board portions 30d of cover 30B. By this, engaging claws 38 of the pair of side board portions 30d of cover 30B can be engaged with the corresponding engaging holes 34 in the pair of side board portions 30b of main body 30A, and consequently main body 30A and cover 30B constitute external case 30 shaped in a rectangular pipe.

A pair of terminal bases 40A and 40B having a plurality of connecting terminals are disposed in the openings at both longitudinal ends of external case 30. Each of the pair of terminal bases 40A and 40B has a pair of positioning pins 42 formed on each of the two surfaces thereof (in FIGS. 3 and 5, the top and bottom surfaces) which are opposed to main board portion 30a of main body 30A of external case 30 and main board portion 30c of cover 30B. These positioning pins 42 are inserted into positioning holes 44 formed on both sides of each of fixing means through holes 32 at the two longitudinal ends of main board portion 30a of main body 30A and at that of main board portion 30c of cover 30B, whereby they are fixed at the predetermined positions in the openings at both longitudinal ends of external case 30. At the predetermined positions, terminal bases 40A, 40B block the two openings at both longitudinal ends of external case 30, so that they prevent dust from entering in an innerspace of external case 30.

Each of the pair of terminal bases 40A and 40B has cutout 45 formed therein for allowing fixing means to be engaged or disengaged with fixing means through hole 32 through cutout 36, correspondingly to fixing means through holes 32 in both ends of main board portion 30a of main body 30A and cutouts 36 in both ends of main board portion 30c of cover 30B.

Each of the pair of terminal bases 40A and 40B has a plurality of lead insertion holes 46 formed therein to face outward in the longitudinal direction of external case 30, and the plurality of external connecting terminals of each of the pair of terminal bases 40A and 40B are provided in the inner ends of the plurality of lead insertion holes 46 and are constructed by self locking type terminal fittings 48. Each self locking type fitting 48 has lower supporting portion 48a substantially along an extended line of a lower end of the corresponding lead insertion hole 46, and upper locking portion 48b which is integrally formed with lower supporting portion 48a. Upper locking portion 48b is located above lower supporting portion 48a, hangs down toward lower supporting portion 48a, and inclined in a direction of going away from the inner end of corresponding lead insertion hole 46.

On a surface of each of the pair of terminal bases 40A and 40B opposed to main board portion 30c of cover 30B of external case 30, a horizontal step is formed at a region located inwardly of positioning pins 42, and this horizontal step functions as circuit board supporting surface 52 for supporting one of both longitudinal ends of circuit board 50 made of a rectangular glass epoxy lamination board. On circuit board supporting surface 52, base end portions 48c of the plurality of terminal fittings 48 of corresponding terminal base 40A or 40B are projecting out.

A predetermined wiring is printed on a lower surface of circuit board 50. A plurality of terminal connecting holes 54 are formed at a plurality of land portions of the printed wiring in both longitudinal ends of circuit board 50. When the both longitudinal ends of circuit board 50 are placed on circuit board supporting surfaces 52 of the pair of terminal bases 40A or 40B, as particularly well shown in FIG. 3, base end portions 48C of the plurality of terminal fittings 48 projected out from circuit board supporting surface 52 of one of the pair of terminal bases 40A and 40B are inserted into corresponding terminal connecting holes 54. The projected ends of the inserted base end portions 48c of terminal fittings 48 are electrically connected by soldering to the corresponding land portions located at both longitudinal ends of the printed wiring of circuit board 50, and simultaneously fix both longitudinal ends of circuit board 50 to circuit board supporting surfaces 52 of the pair of terminal bases 40A and 40B.

In the neighborhood of the respective extended ends of the pair of side board portions 30b of main body 30A of external case 30, a plurality of board supporting protrusions 56 are formed to space from each other in the longitudinal direction thereof. Both side edges of circuit board 50, both longitudinal ends of which are fixed to circuit board supporting surfaces 52 of the pair of terminal bases 40A and 40B placed at the predetermined positions in both longitudinal openings of external case 30, abut on the plurality of board supporting protrusions 56 from underside thereof as particularly well shown in FIG. 4, thereby preventing a cross section of circuit board 50 from upwardly bending in a convex shape.

To the printed wiring of circuit board 50 between the pair of terminal bases 40A and 40B, various electric or electronic parts are connected for constituting a discharge lamp operating circuit including a rectified power supply circuit, inverter oscillation circuit, inverter oscillation circuit starting circuit, sensing and protection circuit for the inverter oscillation circuit and the like.

Relatively large parts each having large current value and large voltage value among those electric or electronic parts are placed on the upper surface of circuit board 50, and relatively small parts each having small current value and small voltage value are placed on the lower surface of circuit board 50.

Relatively large parts on the upper surface of circuit board 50 include transformer 60a as an inverter element, switching transistor 60b used as a switching element, and other various electronic and/or electric parts 60c such as a noise filter, etc. The respective lead terminals 62 of these large parts are inserted into the plurality of lead insertion holes formed in the predetermined positions of circuit board 50, and thereafter soldered to a plurality of land portions of the printed wiring, corresponding to the plurality of lead insertion holes, on the lower surface of circuit board 50.

In addition, core 64 of transformer 60a having the largest size among the relatively large parts is inserted into core insertion opening 50a formed in circuit board 50 and also projecting to the lower surface side of circuit board 50. Moreover, transformer 60a having the largest heat radiating amount and switching transistor 60b which is most effected by heat are placed on both longitudinal ends on the upper surface of circuit board 50.

Radiating board 68 is fixed to the upper surface of switching transistor 60b on the upper surface of circuit board 50 by fixing screw 66 inserted from the lower surface side of circuit board 50.

Relatively small parts 70 each having small current value and small voltage value on the lower surface of circuit board 50 is directly soldered to a predetermined plurality of pad portions of the printed wiring on the lower surface of circuit board 50. Further attached to the lower surface of circuit board 50 are a plurality of rubber supporting columns 72.

The above-mentioned various electric or electronic parts 60a, 60b, 60c, 70 and rubber supporting columns 72 mounted on the upper surface and lower surface of circuit board 50 are lying in the range of height X of the pair of terminal bases 40A and 40B at both longitudinal ends of circuit board 50, as particularly well shown in FIG. 3. In addition, when the pair of terminal bases 40A and 40B to which both longitudinal ends of circuit board 50 are placed at the predetermined positions in the openings in both longitudinal ends of external housing 30, as shown in FIGS. 3 and 4, the plurality of rubber supporting columns 72 on the lower surface of circuit board 50 abut on main board portion 30c of cover 30B of external housing 30, radiating board 68 of switching transistor 60b on the upper surface of circuit board 50 abuts on main board portion 30a of main body 30A of external housing 30, and core 64 of transformer 60a on the upper surface of circuit board 50 abuts on both main board portion 30a of main body 30A and main board portion 30c of cover 30B. And rubber supporting columns 72 press both longitudinal side edges of the upper surface of circuit board 50 onto the plurality of circuit board supporting protrusions 56 in the pair of side board portions 30b of main body 30A by the repulsion force generated in rubber supporting columns 72 by the above abutment.

These abutment and pressing effectively prevent circuit board 50 from generating a howl between both longitudinal ends, at which circuit board 50 is supported by the pair of terminal bases 40A and 40B, by the vibration generated from transformer 60a when the discharge lamp operating circuit of the first embodiment operates.

In addition, the abutment of radiating board 68 of switching transistor 60b and core 64 of transformer 60a upon armor housing 30 facilitates the heat dissipation from these through armor housing 30.

The assembly in the manufacturing line of the electronic discharge stabilizer according to the first embodiment of this invention constructed as detailed above is initiated by first incorporating the above described various electric or electronic parts 60a, 60b, 60c, 70 and the plurality of supporting columns 72 onto circuit board 50. Then, both longitudinal ends of circuit board 50 are fixed to circuit board supporting surfaces 52 of the pair of terminal bases 40A and 40B, and the pair of terminal bases 40A and 40B are fixed at the predetermined positions in the openings in both longitudinal ends of external housing 30 with cover 30B being connected to main body 30A of external housing 30.

In the electronic discharge stabilizer assembled in this way, after it is attached on a predetermined position of the chassis of fluorescent lamp lighting equipment, end portions of the general commercial power supply leads (not shown) and an end portion of an earth lead is inserted into the plurality of lead insertion holes 46 of terminal base 40A in the vicinity of switching transistor 60b on circuit board 50, whereby these leads are self-locked by the plurality of terminal fittings 48 in terminal base 40A.

In addition, end portions of leads of fluorescent bulb sockets (not shown) are inserted into the plurality of lead insertion holes 46 of terminal base 40B in the vicinity of transformer 60a on circuit board 50, whereby these leads are self-locked by the plurality of terminal fittings 48 in terminal base 40B.

In the above described embodiment, since the connection of external leads to the plurality of terminal fittings 48 of the pair of terminal bases 40A and 40B are performed from the exterior in the longitudinal direction, and the external leads are not drawn into external housing 30, it is not required to remove cover 30B of external housing 30 from main body 30A in the above described connection work.

Since the above described various electric or electronic parts 60a, 60b, 60c, 70 and rubber supporting columns 72 are existing in the range of height X of the pair of terminal bases 40A and 40B at both longitudinal ends of circuit board 50 as particularly well shown in FIG. 3, the height of the electronic discharge stabilizer of this embodiment can be Z, which is obtained by only adding the respective thicknesses Y of main body 30A and cover 30B to the above X.

Now, with reference to FIGS. 6 to 11, a description is made to an electronic discharge lamp stabilizer according to a second embodiment of this invention, which is one type of electric circuit apparatuses used for lighting and operating a discharge lamp such as a fluorescent lamp.

Incidentally, in this embodiment, the same members as those used in the above described first embodiment are designated by the same reference numerals, and the detailed description of these members is omitted. In the second embodiment, mainly the arrangement of the various electric or electronic parts on circuit board 50 and the electric circuit constituted by these parts ar described in more detail than the first embodiment.

Figure 6:
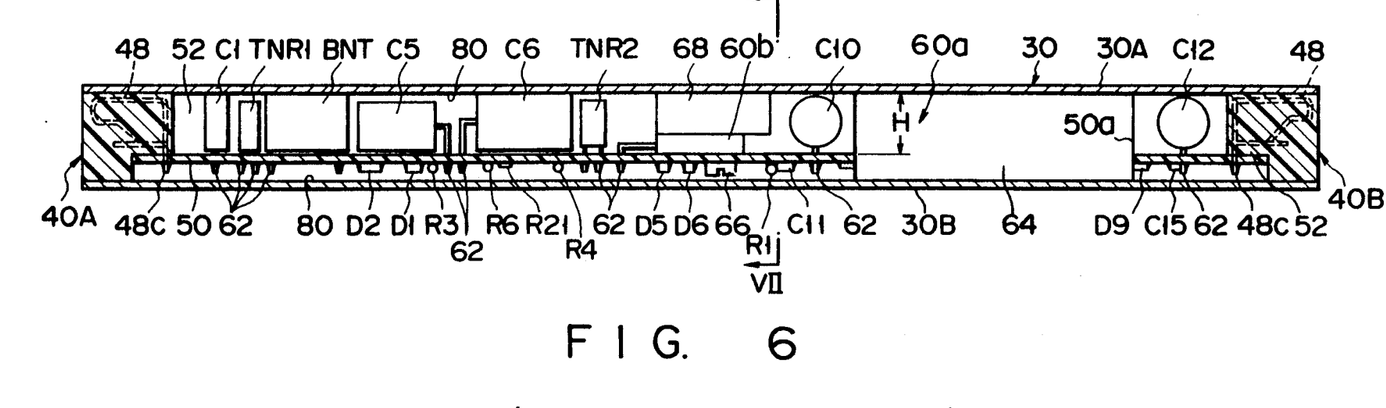
FIG. 6 is a schematic longitudinal sectional view of an electronic discharge lamp stabilizer according to a second embodiment of this invention, which is one type of the electric circuit apparatus used for lighting and operating a discharge lamp such as a fluorescent lamp.
Figure 7:
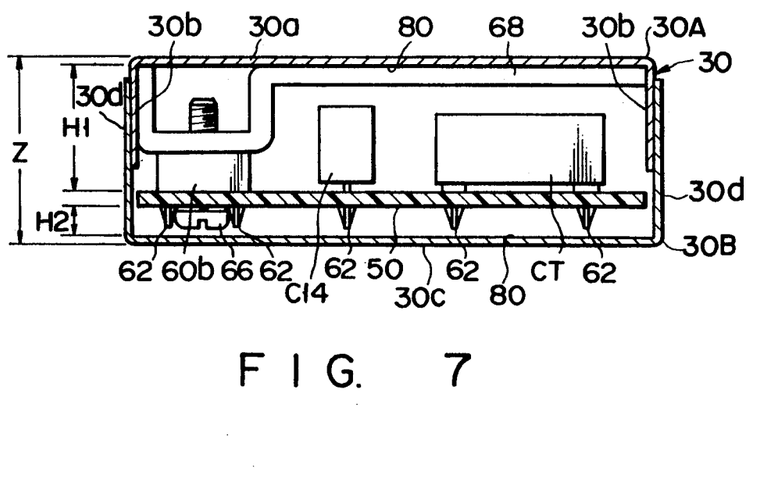
FIG. 7 is a schematic cross-sectional view taken along the line VII—VII in FIG. 6.
Figure 8:
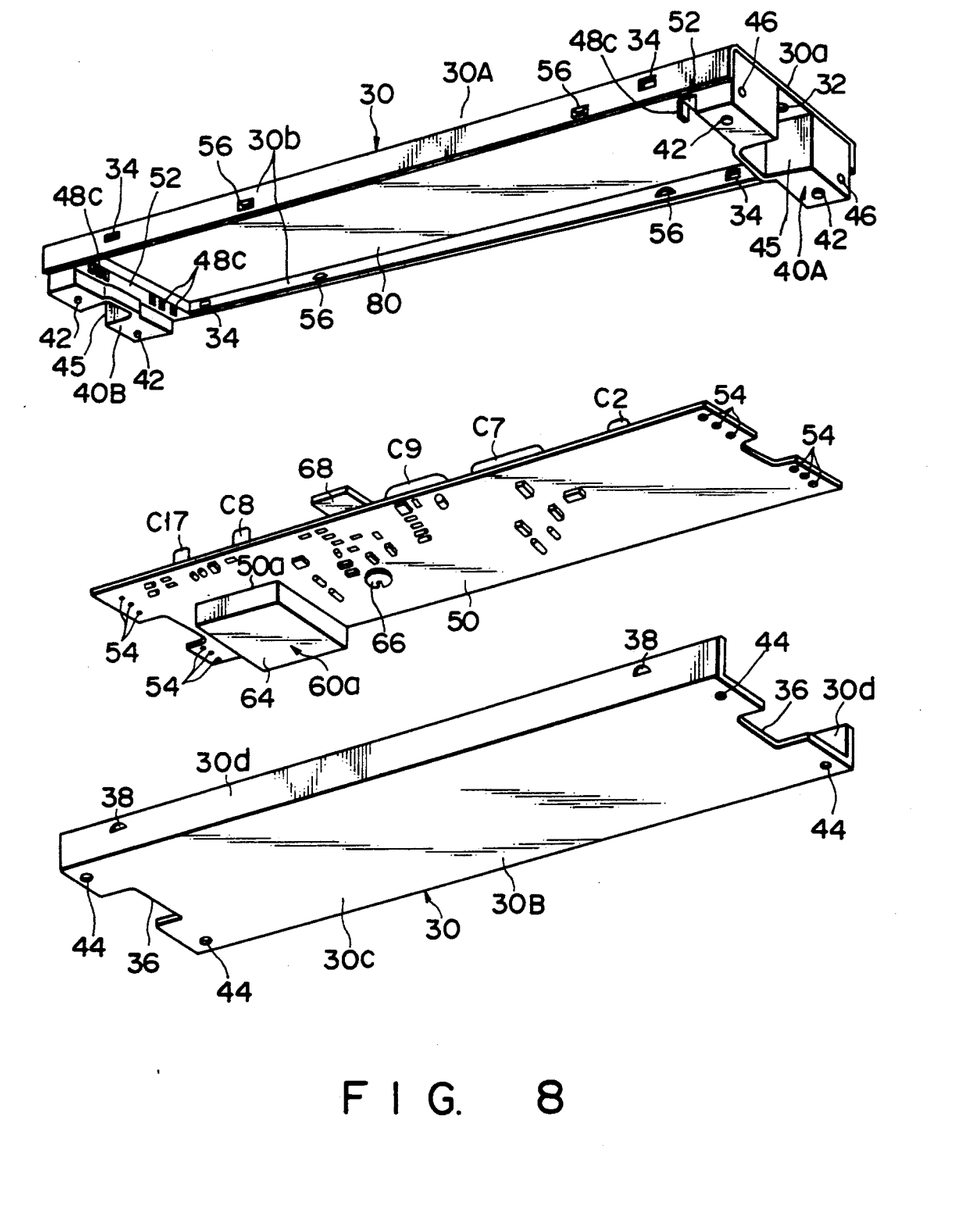
FIG. 8 is a schematic exploded perspective view of the electronic discharge lamp stabilizer in FIG. 6.

In this embodiment, as particularly specifically shown in FIGS. 6 to 8, insulating film 80 such as polyester film is laminated on the inner surface of each of main board portions 30a and 30c of main body 30A and cover 30B of external housing 30, and insulating film 80 is opposed to the various electric or electronic parts on circuit board 50 contained in external housing 30.

Each of main body 30A and cover 30B is pressed into a predetermined cubic shape having main board portion 30a or 30c and a pair of side board portions 30b or 30d after insulating film 80 is laminated to a predetermined area for main board portion in a flat metallic blank punched into a predetermined size.

Figure 9:
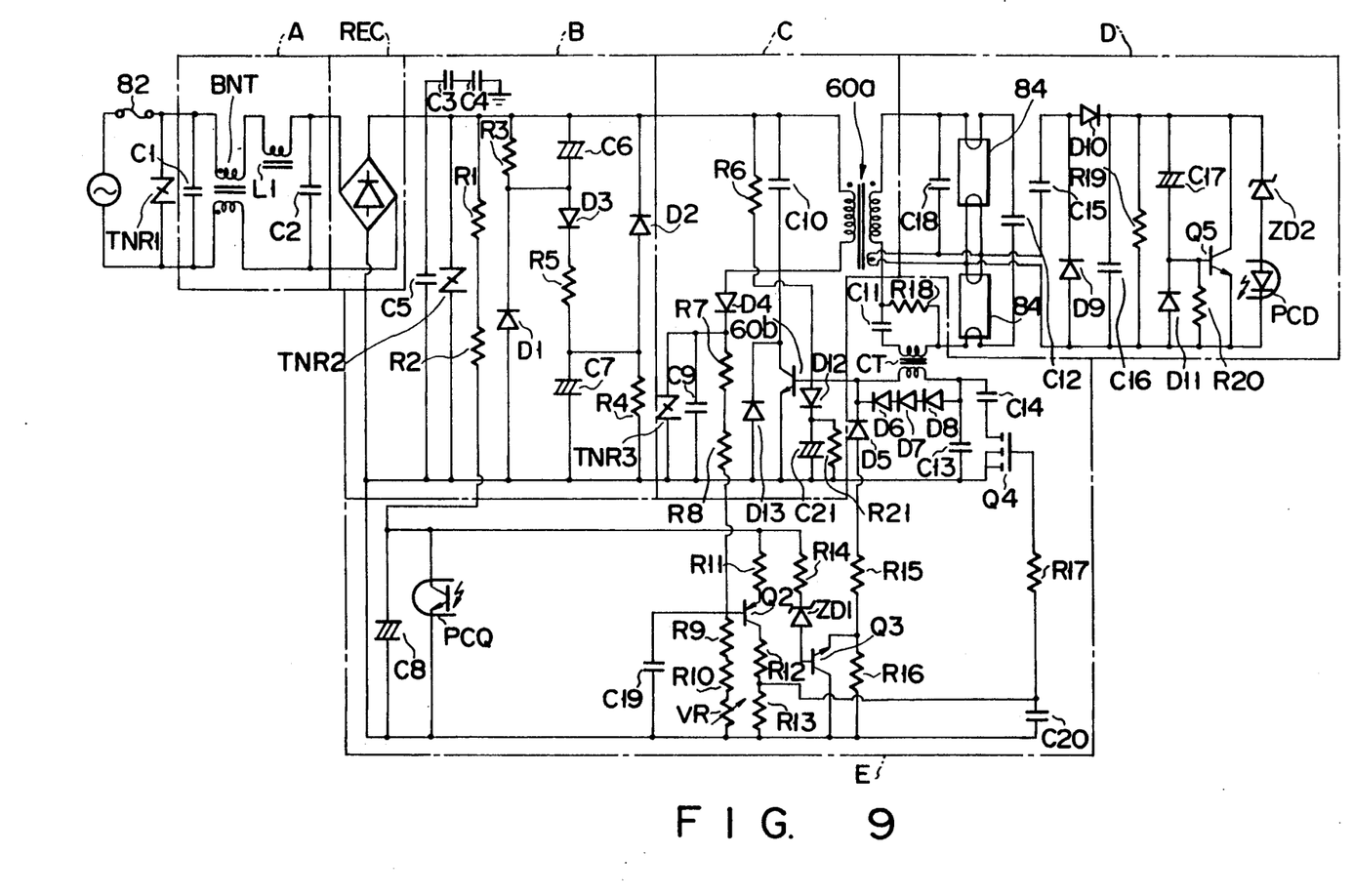
FIG. 9 is a schematic circuit diagram showing an inverter discharge lamp lighting circuit constructed on a circuit board of the electronic discharge lamp stabilizer in FIG. 6.

As shown in FIG. 9, the various electric or electronic parts on circuit board 50 constitute an inverter discharge lamp operating circuit, which includes fuse 82, varistor TNR1 for surge absorption, noise cut filter circuit A, rectifier circuit REC, power supply circuit B for inverter oscillation, inverter oscillation circuit C, circuit block D includes lighting circuit for lighting and operating fluorescent bulb 84 upon receipt of a high-frequency output generated by inverter oscillation circuit C and sensing circuit for the lighting circuit, and operation control circuit E having protection means which senses electric voltage through the sensing circuit and operates to prevent inverter oscillation circuit C from being damaged thereby making the discharge lamp lighting apparatus of this embodiment properly operate Noise cut filter circuit A includes capacitors C1 and C2, noise filter BNT and choke coil L1. Rectifier circuit REC includes four diodes REC1 to REC4 constituting a bridge circuit. Power supply circuit B for inverter oscillation includes capacitors C3 and C4, film capacitor C5, varistor TNR2, resistors R1 to R4, diodes D1 to D3 and smoothing electrolytic capacitors C6 and C7. Inverter oscillation circuit C includes varistor TNR3, film capacitor C9, resistors R6 to R8, diodes D4, D12 and D13, capacitor C10, electrolytic capacitor C21, switching transistor 60b and leakage type inverter transformer 60a. Circuit block D including lighting circuit and sensing circuit has capacitors C12, C15, C16 and C18, electrolytic capacitor C17, diodes D9 to D11, Zener diode ZD2, resistors R19 and R20, transistor Q5 and photodiode PCD for a photo-coupler, and it is connected to fluorescent bulb 84. Operation control circuit E includes capacitors C11, C13, C14, C19, and C20, electrolytic capacitor C8, resistors R9 to R18, variable resistor VR, transistors Q2 to Q4, Zener diode ZD1, diodes D5 to D8, transformer CT, phototransistor PCQ for a photo-coupler.

Among the above-mentioned various electric or electronic parts, relatively large parts having relatively large heat radiating amounts due to their large current value and large voltage value are listed below. Fuse 82, varistors TNR1 to TNR3, capacitors C1 to C5, C9, C10, C12, C14 and C18, electrolytic capacitors C6 to C8, C17 and C21, noise filter BNT, choke coil L1, diodes REC1 to REC4, diodes D4 and D13, resistors R5 and R18, transformer CT, photo-couplers PCD and PCQ, and inverter transformer 60a.

Figure 10:
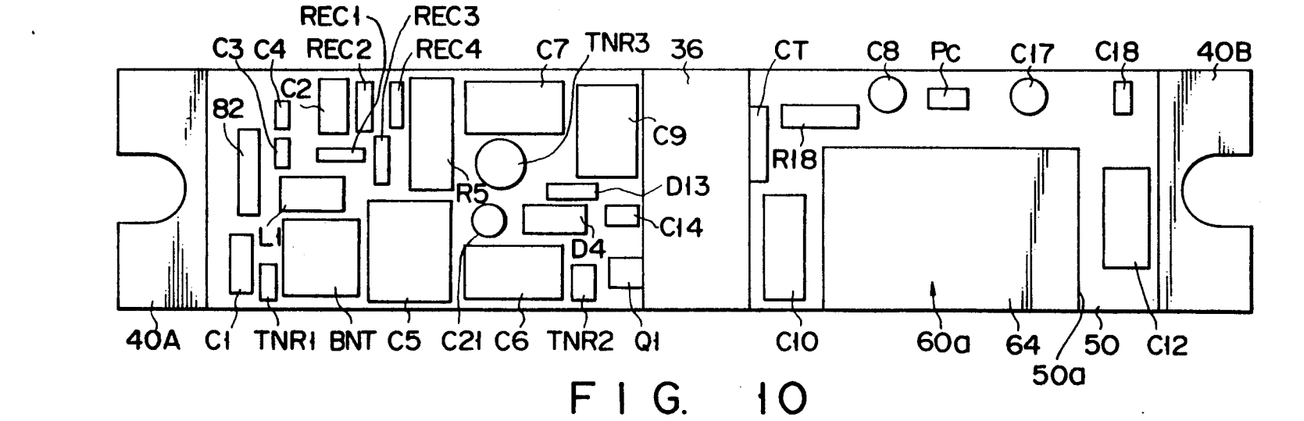
FIG. 10 is a schematic plan view showing an arrangement of various large-sized electric or electronic parts of high current and high voltage on an upper surface of the circuit board of the electronic discharge lamp stabilizer in FIG. 6.

Each of these relatively large parts has lead terminals 62 and is placed on the upper surface side of circuit board 50. Each lead terminal 62 is inserted into corresponding one of a plurality of terminal insertion holes formed at the predetermined positions of circuit board 50 to be corresponded to the plurality of land portions in a predetermined wiring printed on the lower surface of circuit board 50, and its extending end is soldered to the corresponding one of the plurality of land portions in the predetermined wiring.

In FIG. 10, the arrangement of the above described plurality of relatively large parts on the upper surface side of circuit board 50 is schematically shown. Here, these relatively large parts having relatively large heat radiating amounts can have relatively large spaces for heat radiation between them.

In inverter transformer 60a which is largest among these relatively large parts, core 64 is inserted into core insertion hole 50a formed in circuit board 50 in the vicinity of terminal base 40B for a fluorescent bulb socket, and core 64 projects to the lower surface side of circuit board 50. This decreases the projection height H of inverter transformer 60a from the upper surface of circuit board 50. As a result, in spite of supporting both longitudinal ends of circuit board 50 in the middle in the height direction of the pair of terminal bases 40A and 40B, inverter transformer could be made to fall in the range of height of the pair of terminal bases 40A and 40B.

In this embodiment, electrolytic capacitors C6 and C7, film capacitors C5, each having relatively large aspect ratios (that is, size in the longitudinal direction is relatively larger than that in width or diameter direction), have their respective lead terminals 62 bent substantially perpendicularly with respect to their longitudinal directions, and their respective main bodies are arranged so as to lie along the upper surface of circuit board 50. And the extending ends of the respective lead terminals 62 which are substantially perpendicular to the upper surface of circuit board 50 are inserted into the corresponding terminal insertion holes of circuit board 50.

Such arrangement of the parts having relatively large aspect ratios also decreases the heights by which these parts project from the upper surface of circuit board 50, and consequently these parts could be made to fall in the height ranges of the pair of terminal bases 40A and 40B regardless of supporting both longitudinal ends of circuit board 50 in the middle in the height directions of the pair of terminal bases 40A and 40B.

In addition, in spite of the above-mentioned decrease in height, these large parts having relatively large heat radiating amounts are prevented from being affected by the mutual heat radiation by means of the above described relatively large spaces produced their between.

Of the various electric or electronic parts included in the above described various circuits constituting the above described inverter discharge lamp operating circuit, relatively small parts having relatively small current value and small voltage value and having relatively small heat radiating amounts are listed below. Resistors R1 to R4, R6 to R17 and R19 to R21, variable resistor VR, diodes D1 to D3 and D5 to D12, Zener diodes ZD1 and ZD2, transistors Q1 to Q5, and capacitors C11, C13, C15, C16, C19 and C20.

Figure 11:
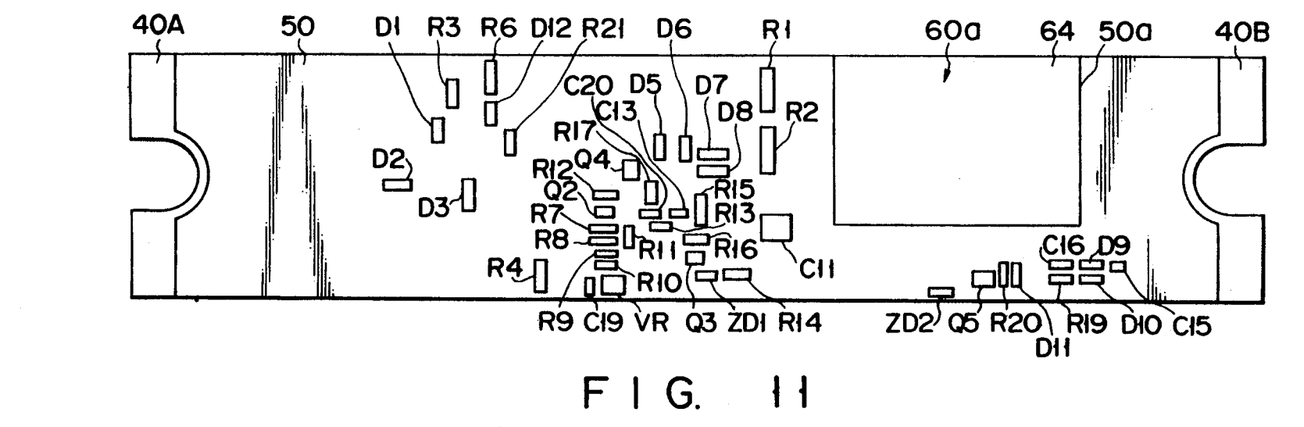
FIG. 11 is a schematic bottom view showing an arrangement of various small-sized electric or electronic parts of low current and low voltage on a underside of the circuit board of the electronic discharge lamp stabilizer in FIG. 6.

These relatively small parts are surface mounted to the plurality of pads of the predetermined wiring printed on the lower surface of circuit board 50. In FIG. 11, the arrangement of the above described plurality of relatively small parts on the lower surface side of circuit board 50 is schematically shown. These relatively small parts having relatively small heat radiating amounts are isolated by circuit board 50 from the effect of the heat generated by the above described relatively large parts having relatively large heat radiating amounts on the upper surface side of circuit board 50.

The mounting of the relatively large parts and relatively small parts onto the upper and lower surfaces of circuit board 50 is described below in detail.

Lead terminals 62 of the above described relatively large parts are inserted into the corresponding lead terminal insertion holes of circuit board 50 from the upper surface side of circuit board 50, and they are temporarily fixed on circuit board 50 by bending or crushing the extending ends projecting to the lower surface side. Then, after an ultraviolet-curing bonding agent is applied on the plurality of pad portions of the predetermined printed wiring on the lower surface of circuit board 50, the above described relatively small parts are mounted on the corresponding pad portions. Further, ultraviolet light is projected on the lower surface of circuit board 50 to cure the ultraviolet-curing bonding agent, so that the above described relatively small parts are temporarily fixed to the corresponding pad portions. Finally, by dipping the lower surface of circuit board 50 into a molten solder, the extending ends of lead terminals 62 of the relatively large parts which are projecting from the lower surface are soldered to the corresponding land portions of the predetermined printed wiring on the lower surface of circuit board 50, and simultaneously the relatively small parts are soldered to the corresponding pad portions.

In the above described second embodiment electrical insulating film 80 is laminated on main board portion 30a of main body 30A of external case 30 and on main board portion 30c of cover 30B, respectively, and thus the height of the pair of terminal bases 40A and 40B can be made small as compared with the conventional ones so that the above described various electric or electronic parts disposed on both the upper and lower surfaces of circuit board 50 are placed within external case 30 more closely to main board portion 30a of main body 30A and main board portion 30c of cover 30B, respectively, as compared with the conventional ones, and hence the heights of the electronic discharge lamp stabilizer of the second embodiment and fluorescent lamp lighting equipment using this as compared with the conventional ones.

For instance, in this embodiment, the height H1 (FIG. 7) needed for placing the above described relatively large parts each having lead terminals 62 on the upper surface of circuit board 50 (that is, the height by which the pair of terminal bases 40A and 40B are upwardly projecting from the upper surface of circuit board 50) is about 13 mm, the height H2 (FIG. 7) needed for placing the above described relatively small parts on the lower surface of circuit board 50 (that is, the height by which the pair of terminal bases 40A and 40B are downwardly projecting from the lower surface of circuit board 50) is about 3 mm, and the height of external case 30 obtained by adding the thickness of circuit board 50 and the respective thicknesses of main board portion 30a of main body 30A and main board portion 30c of cover 30B to the height, H1 and H2 could be made about 20 mm.

Although, in the above described embodiment, only the core 64 of inverter transformer 60a which is largest among the relatively large parts is inserted into core insertion opening 50a formed in circuit board 50 and is projecting from the upper surface side to the lower surface of circuit board 50, it is also possible that insertion openings are formed for other relatively large parts and those other relatively large parts are inserted into the insertion openings to project from the upper surface side to the lower surface side of circuit board 50.

An electronic discharge lamp stabilizer according to a third embodiment of this invention, which is one type of electric circuit apparatuses used for lighting and operating a discharge lamp such as a fluorescent lamp is now described with reference to FIGS. 12 to 14.

In this embodiment, the same members as those used in the above described first embodiment are designated by the same reference numerals, and the detailed explanation of those members is omitted. In the third embodiment, an arrangement of various electric and electronic parts on circuit board 50 and an arrangement of electrical insulators on external housing 30 and heat radiating boards on circuit board 50 are mainly described in detail.

Figure 12:
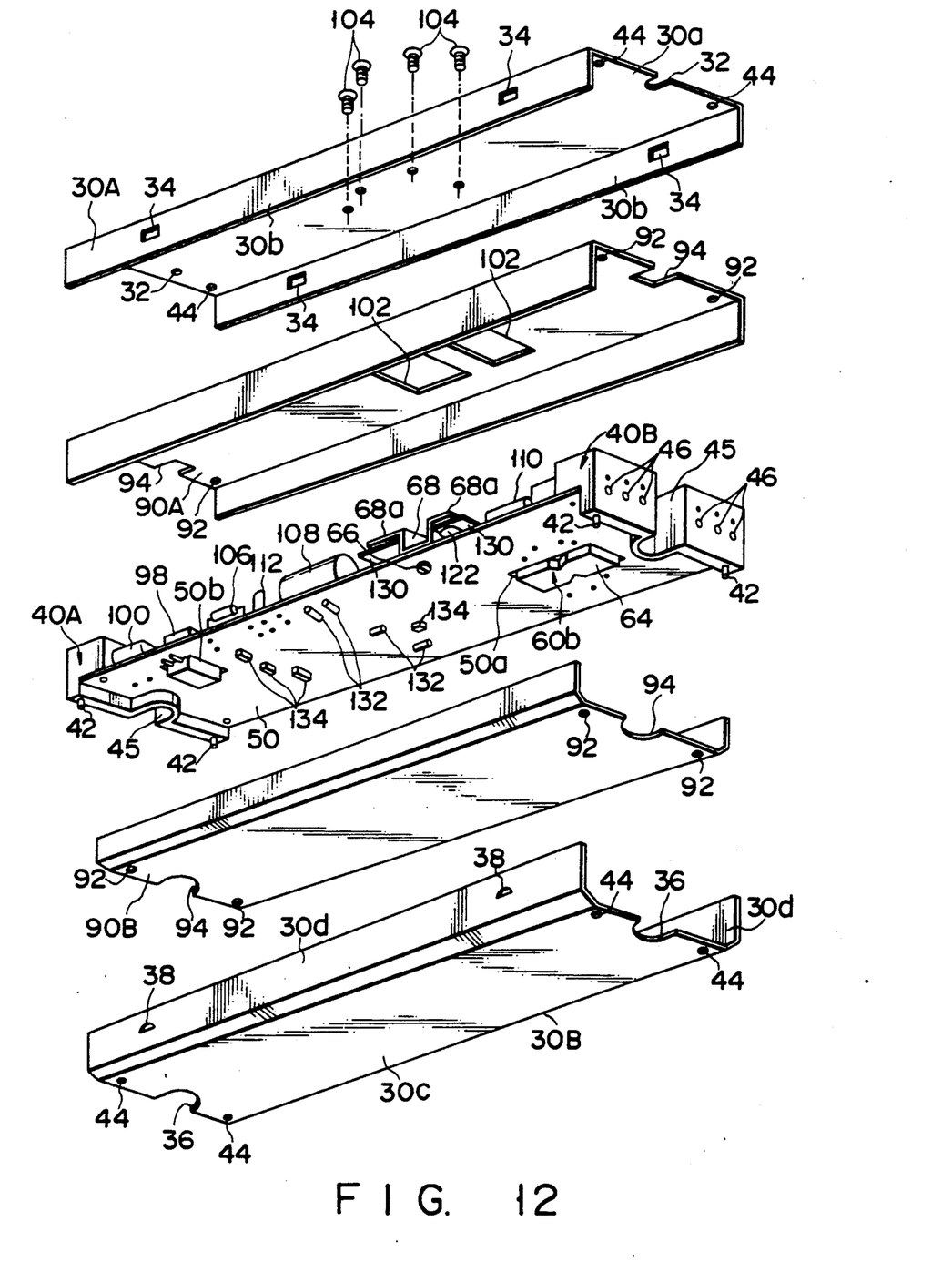
FIG. 12 is a schematic exploded perspective view of an electronic discharge lamp stabilizer according to a third embodiment of this invention, which is one type of the electric circuit apparatus used for lighting and operating a discharge lamp such as a fluorescent lamp.
Figure 14:
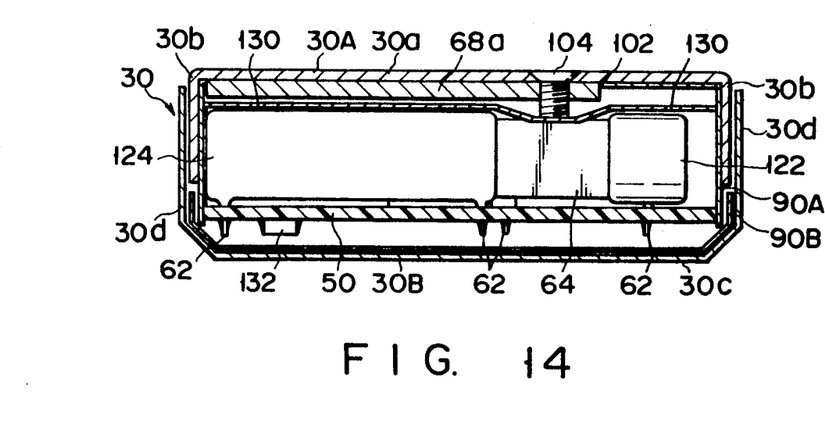
FIG. 14 is a schematic cross-sectional view taken along the line XIV—XIV in FIG. 13.

In this embodiment, as particularly specifically shown in FIGS. 12 and 14, electrical insulators 90A and 90B made of a synthetic resin which have substantially same shapes as main body 30A and cover 30B of external housing 30 are disposed along the respective inner surface of main body 30A and cover 30B. In both longitudinal ends of each of electrical insulators 90A and 90B, a plurality of positioning pin insertion holes 92 and cutout 94 are formed to correspond to the plurality of positioning pins 42 and cutout 45 of each of the pair of terminal bases 40A and 40B.

In this embodiment, transformer 60a is placed on the upper surface of circuit board 50 in the neighborhood of terminal base 40B for fluorescent bulb sockets, and choke coil 98 included in the noise filter and film capacitor 100 are placed on the upper surface in the neighborhood of terminal base 40 for general commercial power supply, and switching transistor 60b is placed on the upper surface between transformer 60a, and choke coil 98 and film capacitor 100.

In this embodiment, choke coil 98, similarly to transformer 60a, is also inserted into choke coil insertion opening 50b formed in circuit board 50 and projecting from the upper surface side to the lower surface side of circuit board 50, whereby the projection height of choke coil 98 from the upper surface of circuit board 50 is reduced.

In electrical insulator 90A disposed on the inner surface of main body 30A of external housing 30, a pair of radiating board insertion openings 102 are formed at positions corresponding to a pair of horizontally extended portions 68a of radiating board 68 of switching transistor 60b on the upper surface of circuit board 50. The pair of horizontally extended portions 68a are positioned within the pair of radiating board insertion openings 102, and fixed to main board portion 30a of main body 30A by fixing screws 104 while they are in direct contact with main board portion 30a of main body 30A.

In this embodiment, since radiating board 68 of switching transistor 60b is fixed to main board portion 30a of main body 30A as described above, no circuit board supporting protrusions are formed in each of the pair of side board portions 30b of main body 30A of external housing 30.

The structure of transformer 60a is now described in detail. Transformer 60a is a leakage type transformer having a flat shape, and core 64 of transformer 60a consists of a pair of upper and lower ferrite core pieces symmetrically shaped with respect to each other and each having a basic E shape. One core piece has a horizontally extended portion which constructs a main body of E shape, two arm portions which are extending in one direction from both longitudinal ends of the horizontally extended portion and construct two end arms of E shape, one arm portion which is extending in the same direction as that of the two arm portions from a longitudinal center of the horizontally extended portion and construct one center arm of E shape, and two auxiliary arm portions which are extending in the same direction as that of the three arm portions from two positions on the horizontally extended portion between the three arm portions. The one central arm portion is slightly shorter in length than the two arm portions at both longitudinal ends, and the pair of auxiliary arm portions are shorter in length than central one arm portion. The upper and lower core pieces symmetrically shaped each other and each having a basic E shape are combined with the extending ends of the respective three arm portions and two auxiliary arm portions being opposed to each other. And only the extending ends of the two pairs of arm portions at both longitudinal ends of the upper and lower core pieces are closely abutted by each other to form a closed magnetic path, a little magnetic gap for preventing magnetic saturation is created between the extending ends of the pair of central arm portions, and a relatively large magnetic gap for acting as a leakage type transformer is created between the extending ends of the two pairs of auxiliary arm portions.

Between the respective three arm portions and two auxiliary arm portions of the upper and lower core pieces combined with each other, a pair of inner coil insertion passages are created between the pair of central arm portions and the two pairs of auxiliary arm portions, and a pair of outer coil insertion passages concentrical with the inner coil insertion passages are created between the two pairs of auxiliary arm portions and the two pairs of arm portions at both longitudinal ends.

A unit of primary windings 64a is passed through the inner coil insertion passages and a unit of secondary windings 64b is passed through the outer coil insertion passages, whereby the unit of secondary windings 64b is placed within the same horizontal plane as the unit of primary windings 64a and concentrically therewith.

Leakage type transformer 60a having such flattened structure has a good feature that it is much smaller in height as compared with the conventional leakage type transformer of the same type and has a good conversion efficiency because of the concentrical arrangement of the unit of primary windings 64a and the unit of secondary windings 64b as described above.

In the above described leakage type flattened transformer 60a, core 64 is inserted into core insertion opening 50b of circuit board 50 with the unit of primary winding 64a and the unit of secondary winding 64b being placed on the upper surface of circuit board 50.

Also in this embodiment, large-sized parts having large current value and large voltage value and having relatively large heat radiating amounts among the many electric or electronic parts attached to circuit board 50 have their respective leads 62 inserted into the corresponding lead insertion holes formed in the predetermined positions of circuit board 50 from the upper surface side of circuit board 50, and soldered to the predetermined land portions of the predetermined electric wiring of circuit board 50 on the lower surface side of circuit board 50.

The above described large parts include, in addition to the above described choke coil 98, film capacitor 100, transformer 60a and switching transistor 60b, diode 106 for a rectifying circuit, electrolytic capacitors 108 and 110, varistor 112, resistors 114 and 116, variable resistors 118 and 120, film capacitors 122 and 124 and diodes 126 and 128.

In these large parts, film capacitor 100, electrolytic capacitors 108 and 110 and resistor 114 longitudinal lengths of which are relatively large as compared with the widths or diametrical lengths thereof have the extending ends of their respective leads 62 bent substantially perpendicularly to their respective longitudinal directions, and their respective main bodies are disposed along the upper surface of circuit board 50.

Figure 13:
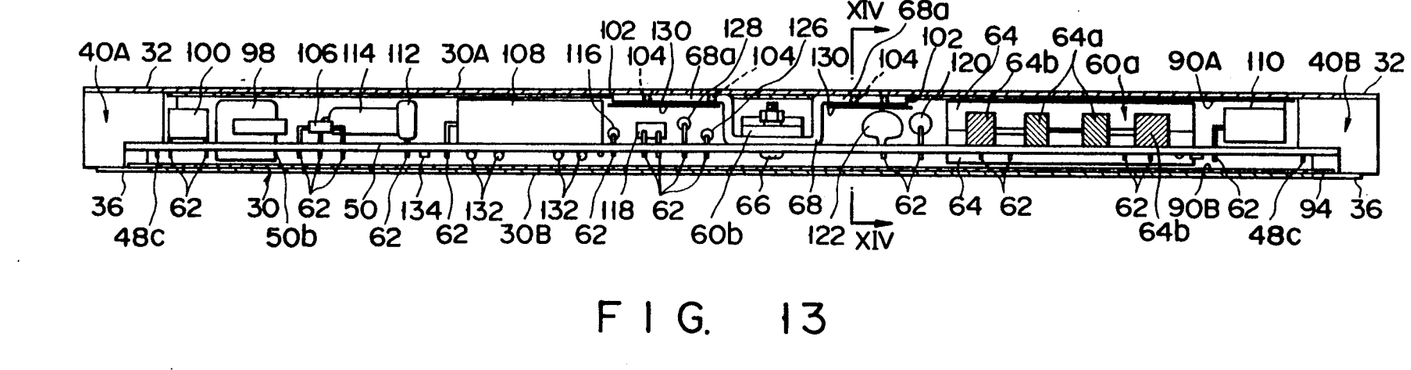
FIG. 13 is a schematic longitudinal sectional view of the electronic discharge lamp stabilizer in FIG. 12.

In these large parts, resistor 116, variable resistor 118, film capacitors 122 and 124 and diodes 126 and 128 having relatively low heights are positioned below the pair of horizontally extended portions 68a of radiating board 68, as shown in FIGS. 13 and 14. On the lower surface of the pair of horizontally extended portions 68a of radiating board 68, insulating boards 130 of a synthetic resin are provided for assuring electrical insulation between the various parts positioned below horizontally extended portions 68 of radiating board 68 and the lower surfaces of horizontally extended portions 68.

Such construction increases a region on the upper surface of circuit board 50 at which large parts can be mounted, without increasing the whole area of the upper surface. That is, since the same amount of parts as before can be mounted even with a region smaller than before, the miniaturization of circuit board 50 and hence the miniaturization of the electronic discharge lamp stabilizer of this embodiment and fluorescent lamp operating equipment using this are provided.

Also in this embodiment, small-sized parts having small current value and small voltage value and having relatively small heat radiating amounts among the many electric or electronic parts attached to circuit board 50 are soldered to the predetermined pad portions of the predetermined electric wiring of circuit board 50 on the lower surface side of circuit board 50. These small-sized parts include resistor 132, diode 134, etc.

In this embodiment, choke coil 98 and film capacitor 100 both of which are included in the noise filter, and transformer 60a are placed on the upper surface of circuit board 50 in the respective vicinities of terminal base 40A for a general commercial power supply and terminal base 40B for fluorescent bulb sockets, both terminal bases 40A, 40B being adjoining to the external space, and in addition switching transistor 60b is placed between transformer 60a and a group of choke coil 98 and film capacitor 100, so that the radiation of the heats generated from transformer 60a and choke coil 98 and film capacitor 100 is good and switching transistor 60b can effectively prevented from being affected by the heats generated from them.

Moreover, since radiating board 68 for switching transistor 60b directly fixed to main board portion 30a of main body 30A of external case 30 increases the heat radiating efficiency from switching transistor 60b through external case 30, switching operation of switching transistor 60b stabilizes, and as a result, a predetermined current having a very small change in a voltage flows in the fluorescent bulb in the fluorescent lamp lighting equipment using the electronic discharge stabilizer of this embodiment, providing no reduction in life of the fluorescent bulb.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. An electric circuit apparatus comprising:
    a long and narrow case having two openings at respective longitudinal ends thereof, said case having a flattened rectangular cylindrical shape and having upper and lower walls which are parallel to each other;
    a long and narrow circuit board contained in said case, on which electrical components are attached and in which an electrical circuit connected to the parts is mounted, said circuit board having longitudinal ends;
    a pair of terminal bases respectively mounted at the two openings within said case and each terminal base including at least one external connecting terminal externally opened in the longitudinal direction of said case, said terminal bases being sandwiched between the parallel upper and lower walls of said case, said terminal bases supporting respective longitudinal ends of said circuit board and having said external connecting terminal connected to the electrical circuit of said circuit board;
    the electrical components being positioned within the respective height ranges of said terminal bases; and
    an electrical insulator is mounted on an inner surface of said case which is opposed to said circuit board.

2. An electric circuit apparatus according to claim 1, wherein said pair of terminal bases respectively block the two openings of said case.

3. An electric circuit apparatus according to claim 1, further comprising:
    a positioning projection mounted on each of said pair of terminal bases; and
    positioning holes formed in the longitudinal ends of said case, for respectively receiving the positioning projections of said terminal bases.

4. An electric circuit apparatus according to claim 1, wherein:
    said case includes a main body and a cover which are separable from each other in a height direction thereof; and
    at least one of said external connecting terminals includes a self locking type terminal fitting.

5. An electric circuit apparatus according to claim 4, wherein said pair of terminal bases respectively block the two openings of said case.

6. An electric circuit apparatus according to claim 1, wherein;
    said case includes a main body and a cover which are separable from each other in a height direction thereof; and
    said electrical insulator is mounted on inner surfaces of the main body and cover, which are opposed to said circuit board.

7. An electric circuit apparatus according to claim 6, wherein said electrical components include:
    relatively large-sized oblong parts which are arranged on one side surface of said circuit board so that longitudinal directions of said oblong parts lie along the one side surface of said circuit board; and
    relatively small-sized parts which are arranged on another side surface of said circuit board.

8. An electric circuit apparatus accorading to claim 6, wherein:
    said main body of said case includes a rectangular main body portion having two longitudinal extending side edges, and a pair of side body portions which project substantially in parallel with each other in one side surface side of the main body portion from both longitudinally extending side edgs of the main body portion;
    said cover of said case includes a rectangular main cover portion having two longitudinally extending side edges, and a pair of side cover portions which project substantially in parallel with each other in one side surface side of the main cover portion from both longitudinally extending side edges of the main cover portion;
    said cover is detachably connected to said main body with the main cover portion opposing to the main body portion of the main body and the pair of side cover portions overlapping the pair of side body portions of the main body, thereby constituting said case shaped in a form of a rectangular pipe; and said electrical components include large-sized oblong parts having relatively large voltage and current values which are arranged on one side surface of said circuit board so that longitudinal directions of said oblong parts lie along the one side surface of said circuit board, and relatively small-sized parts having relatively small voltage and current values which are arranged on another side surface of said circuit board.

9. An electric circuit apparatus according to claim 1, wherein: the electrical components on said circuit board include a switching element having a radiating board; and said electrical insulator has an opening at a position corresponding to the position of the radiating board of the switching element on said circuit board, the radiating board of the switching element being inserted into said opening of said electrical insulator to abut on an inner surface of said case.

10. An electric circuit apparatus comprising:

a long and narrow case having two openings at respective longitudinal ends thereof, said case having a flattened rectangular cylindrical shape and having upper and lower walls which are parallel to each other;

a long and narrow circuit board contained in said case, on which electrical components are attached and in which an electrical circuit connected to the electrical components is mounted, said circuit board having longitudinal ends;

a pair of terminal bases respectively mounted at the two openings within said case and each terminal base including at least one external connecting terminal externally opened in the longitudinal direction of said case, said terminal bases being sandwiched between the parallel upper and lower walls of said case, said terminal bases supporting respective longitudinal ends of said circuit board and having their respective external connecting terminal connected to the electrical circuit of said circuit board;

the electrical components being positioned within the respective height ranges of said terminal bases; and said electrical circuit of said circuit board including an inductance element and a switching element which comprises an inverter lighting circuit for lighting and operating a discharge bulb, and further includes a noise filter;

the external connecting terminal of one of said pair of terminal bases being connectable with a power supply, and the external connecting terminal of the other of said pair of terminal bases being connectable with the discharge bulb; and on said circuit board, said switching element of said electrical circuit is arranged between said pair of terminal bases, the noise filter of said electrical circuit is arranged between one longitudinal end of said circuit board and the switching element to cut noise in an electrical current which is inputted from the external connecting terminal of said one terminal base which is connectable with the power supply and which is supplied to the inverter lighting circuit, and the inductance element of said electrical circuit is arranged between the other longitudinal end of said circuit board and the switching element to feed out the current supplied to the inverter lighting circuit through the noise filter from the external connecting terminal of said one terminal base which is connectable with the power supply to the external connecting terminal of the other terminal base which is connectable with the discharge bulb.

11. An electric circuit apparatus according to claim 10, wherein:

the inductance element of said electrical circuit on said circuit board includes a core; and said circuit board has an opening formed therein into which said core of the inductance element is inserted.

12. An electric circuit apparatus according to claim 10, further comprising:

a positioning projection mounted on each of said pair of terminal bases; and positioning holes formed in the longitudinal ends of said case, for respectively receiving the positioning projections of said terminal bases.

13. An electric circuit apparatus according to claim 10, wherein;

said case includes a main body and a cover which are separable from each other in a height direction thereof; and at least one of said external connecting terminals includes a self locking type terminal fitting.

14. An electric circuit apparatus according to claim 13, wherein said pair of terminal bases respectively block the two openings of said case.

15. An electric circuit apparatus according to claim 10, wherein said pair of terminal bases respectively block the two openings of said case.

* * * * *